(12) United States Patent
Lorenz

(10) Patent No.: US 6,507,304 B1
(45) Date of Patent: Jan. 14, 2003

(54) CURRENT STEERING SEGMENTED DAC SYSTEM

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/139,044

(22) Filed: May 2, 2002

(51) Int. Cl.[7] .................................................. H03M 1/66
(52) U.S. Cl. ........................ 341/144; 341/118; 341/120; 341/143; 341/145; 341/150; 341/153; 341/135
(58) Field of Search ................................. 341/118, 120, 341/143, 144, 145, 150, 153, 135

(56) References Cited

U.S. PATENT DOCUMENTS

| | | | | |
|---|---|---|---|---|
| 4,896,157 A | * | 1/1990 | Mijuskovic | 341/144 |
| 5,625,360 A | * | 4/1997 | Garrity et al. | 341/144 |
| 5,949,362 A | * | 9/1999 | Tesch et al. | 341/144 |
| 6,329,941 B1 | * | 12/2001 | Farooqi | 341/144 |
| 6,369,733 B1 | * | 4/2002 | Tucker et al. | 341/143 |
| 6,433,722 B1 | * | 8/2002 | Gata et al. | 341/144 |

* cited by examiner

Primary Examiner—Don Phu Le
Assistant Examiner—Lam Mai
(74) Attorney, Agent, or Firm—Brett A. Hertzberg; Merchant & Gould

(57) ABSTRACT

A segmented digital-to-analog converter circuit employs a tri-level technique to provide an output current in response to a bit code. DAC slice circuits are activated in unary fashion in response to their respective control signal, which are provided by a decoder circuit in response to the high-order bits. Each DAC slice circuit provides a binary weighted current to a summing node in response to the middle-order bits. One of the DAC slice circuits is selected to direct a portion of its total current to the input of a DAC_LOW circuit, where the input current is divided to provide a divided current to the summing node in response to the low-order bits. At certain code transitions a different DAC slice circuit is selected to provide the input current, and the previously selected DAC slice circuit redirects its total current to the summing node such that differential non-linearity errors are minimized.

20 Claims, 4 Drawing Sheets

CURRENT STEERING SEGMENTED DAC SYSTEM

FIELD OF THE INVENTION

The present invention is related to digital-to-analog converter technology. More particularly, the present invention is related to a segmented digital-to-analog converter using a tri-level combination of unary and binary techniques such that differential non-linearity errors are minimized.

BACKGROUND OF THE INVENTION

Digital-to-analog converters (DACs) may be arranged to convert digital code words into analog voltages. The digital code word consists of a number (N) of binary bits ($b_1$ $b_2$ ... $b_N$). The analog voltage from the DAC corresponds to a particular binary scaling of a full-scale voltage (VFS), where the binary scaling is related to the digital code word. The minimum step size for the analog output voltage, between adjacent code words, corresponds to $VFS/2^N$. A typical conversion from the N-bit digital code word to an analog voltage (Vout) yields the following transfer function:

$$Vout = VFS \times \left(\frac{b_1}{2^1} + \frac{b_2}{2^2} + \ldots + \frac{b_N}{2^N}\right)$$

The above identified equation results in a transfer function with equal step sizes between each adjacent code word. However, non-ideal conditions in the DAC implementation may have non-equal step sizes that result in errors in the conversion. A differential non-linearity (DNL) error in a DAC corresponds to a non-uniform deviation in the ideal step size between adjacent code words. Large differential non-linearity errors may result in an unchanged output voltage between adjacent codes such that the adjacent code is effectively missing.

Binary-weighted current steering DACs include an array of current sources that are arranged to provide a total current (Iout) to a load circuit in response to a digital code word. Each current source in the array is arranged to provide a portion of the total current (Iout) to the load circuit. The total current is given by the following transfer function:

$$Iout = b_1 \times I + b_2 \times 2^*I + \ldots + b_N \times 2^{N-1} \times I$$

The binary-weighted DAC is implemented with an array of unequal current sources that are scaled relative to one another to provide binary weighted currents. The worst code transitions are observed in the transfer function when a single larger current source is activated, and several smaller current sources are deactivated. Non-ideal output current can be observed at these code transitions due to mismatches between the current source elements, resulting in high DNL error. Mismatches in the relative accuracy of the current sources are primarily a result of processing variations. Binary DACs are very space efficient.

A unary DAC employs a thermometer decoder that is arranged to activate unit current sources, all of which have equal value, in sequence as the code word increases in value. For example, a 9-bit DAC has 512 steps from 0 to 511, where each step corresponds to an additional unit current source. As a code increases over the range of the transfer function, additional current sources are activated without deactivating any of the previously active current sources. The unary DAC results in excellent DNL error performance, at the cost of additional die area (or space).

Segmented DACs employ a combination of the binary weighted DAC and the unary DAC topologies. High-order bits are implemented in the unary portion, while low-order bits are implemented in a binary weighted portion. For example, a 9-bit DAC may be implemented as a segmented DAC with bits 1–5 being implemented in binary fashion, while bits 6–9 are implemented in unary fashion. For this example, the unary portion requires 16 unary current sources, while the binary weighted portion requires 5 binary current sources. The segmented DAC provides a good tradeoff between the unary and binary-weighted DAC implementations, with overall good DNL and reasonable space requirements (die area).

SUMMARY OF THE INVENTION

Briefly stated, a segmented digital-to-analog converter circuit that employs a tri-level technique that provides an output current in response to a conversion code that is provided by data bits. A decoder circuit is employed to provide control signals in response to the high-order bits, for the unary part. DAC slice circuits are selectively activated in unary fashion in response to a respective control signal. Each DAC slice circuit provides a binary weighted current to a summing node in response to the middle-order bits. One of the DAC slice circuits is selected to direct a portion of its total current to the input of a DAC_LOW circuit. The DAC_LOW circuit divides the input current using binary weighted current division and provides a divided current to the summing node in response to the low-order bits. At certain code transition, the previously selected DAC slice circuit directs its total current to the summing node, and another DAC slice circuit is selected to provide the input current to the DAC_LOW circuit. Since none of the currents from the DAC slice circuits are thrown away, differential non-linearity errors are minimized.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a," "an," and "the" include plural references. The meaning of "in" includes "in" and "on."

Figure 1:
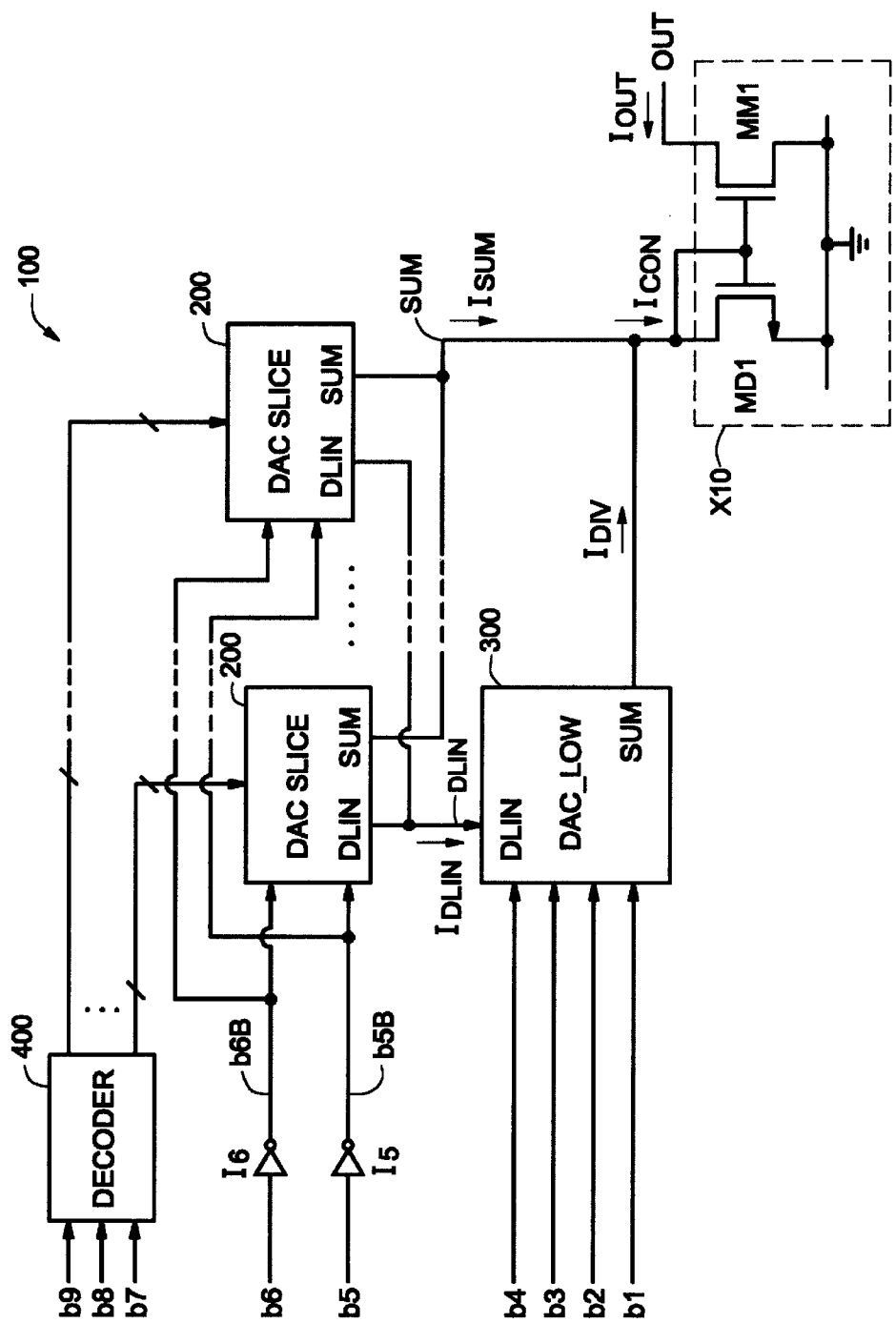
FIG. 1 is a schematic diagram of an exemplary digital-to-analog converter (DAC) system.

FIG. 1 is a schematic diagram of an exemplary digital-to-analog converter (DAC) system (100) that is arranged in accordance with the present invention. DAC system 100 includes an array of DAC slice circuits (200), a DAC_LOW circuit (300), a decoder circuit (400), inverter circuits (I5, I6), and an optional current mirror circuit (X10). Optional current mirror circuit X10 includes transistors MD1 and MM1.

Decoder circuit 400 is arranged to operate as a means for providing control signals in response to high-order bits $b_7$–$b_9$. Inverter circuits I5 and I6 provide inverse data bit signals b5B and b6B in response to middle-order bits $b_5$ and $b_6$, respectively. Each DAC slice circuit (200) receives a respective set of control signals from decoder circuit 400, and provides a segment current to node SUM in response to the respective control signals and inverse data bits $b_{5B}$–$b_{6B}$. DAC slice circuits 200 collectively provide a: sum current (ISUM) to the SUM node. A selected one of the DAC slice circuits (200) provides a DAC_LOW input current (IDLIN) to the DLIN node. Each DAC slice circuit is thus arranged to operate as a means for providing a segment current in response to the middle-order bits when selected. One of the DAC slice circuits is also arranged to operate as a means for providing the DAC_LOW input current (IDLIN).

DAC_LOW circuit 300 is arranged to receive DAC_LOW input current IDLIN from node DLIN, and provides a divided current (IDIV) in response to low-order bits $b_1$–$b_4$. A conversion current (ICON) corresponds to the sum of the sum current (SUM) and the divided current (IDIV). The conversion current corresponds to the digital-to-analog conversion of data bits $b_1$–$b_9$. DAC_LOW circuit 300 is thus arranged to operate as a means for providing the divided current in response to the DAC_LOW input current and the low-order bits.

Optional current mirror circuit X10 is arranged to provide an output current (IOUT) that is related to the conversion current (ICON) by a scaling factor such that the conversion current is conditioned and provided for use in another circuit (not shown). Thus, the optional current mirror circuit operates as a means for providing the output current in response to the conversion current.

As shown in FIG. 1, the conversion from a digital code to a conversion current is determined by a number (N) of data bits (e.g., $b_1$–$b_9$). Decoder circuits 400 is arranged to provide sets of control signals in response to high-order bits (e.g., $b_7$–$b_9$), DAC slice circuits are arranged to provide currents in response to middle-order bits (e.g., $b_5$–$b_6$), and DAC low circuit 300 is arranged to provide a current in response to the low-order bits (e.g., $b_1$–$b_4$). Although nine data bits are illustrated in FIG. 1, any number of data bits may be arranged in accordance with the present invention. For example, N data bits may be grouped into "i" low-order bits, "j" middle-order bits, and "k" high-order bits.

DAC slice circuits are each arranged to receive a set of control signals as previously described. The number of DAC slice circuits in the array corresponds to the number of high-order bits that are employed in the system. For example, when three high-order bits are used in DAC system 100, eight DAC slice circuits are used. Thus, the number of DAC slice circuits in the system, and their associated control signals, correspond to a numerical relationship as given by $2^k$, where "k" corresponds to the number of high-order bits that are employed in the system.

Each DAC slice circuit (200) contributes to the sum current (ISUM) as previously described. The high-order bits (e.g., $b_7$–$b_9$) have an associated binary code word. The decoder circuit (400) is arranged to provide a thermometer decode of the high-order bits such that additional slice circuits (200) are selected as the code word associated with the high-order bits increases. Adjacent DAC slice circuits are enabled in sequence, where the total number of segments that are selected corresponds to the code word associated with the high-order bits.

The DAC slice circuits are each arranged to operate as a means for converting the middle-order bits to a segment current when selected by a respective one of the segment control signals. The DAC slice circuits each operate in one of three operating states ("fully off," "partially on," and "fully on"). In the "fully off" operating state, the DAC slice circuit provides no output current to either the SUM or DLIN nodes. In the "partially on" operating state, the DAC slice circuit provides a segment current to the SUM node based on data bits $b_5$ and $b_6$, and another current to the DLIN node. A selected one, and only one, of the DAC slice circuits is in a "partially on" operating state. In the "fully on" operating state, the DAC slice circuit provides all of its current (the segment current and an extra current) to the SUM node, and no current to the DLIN node.

Figure 2:
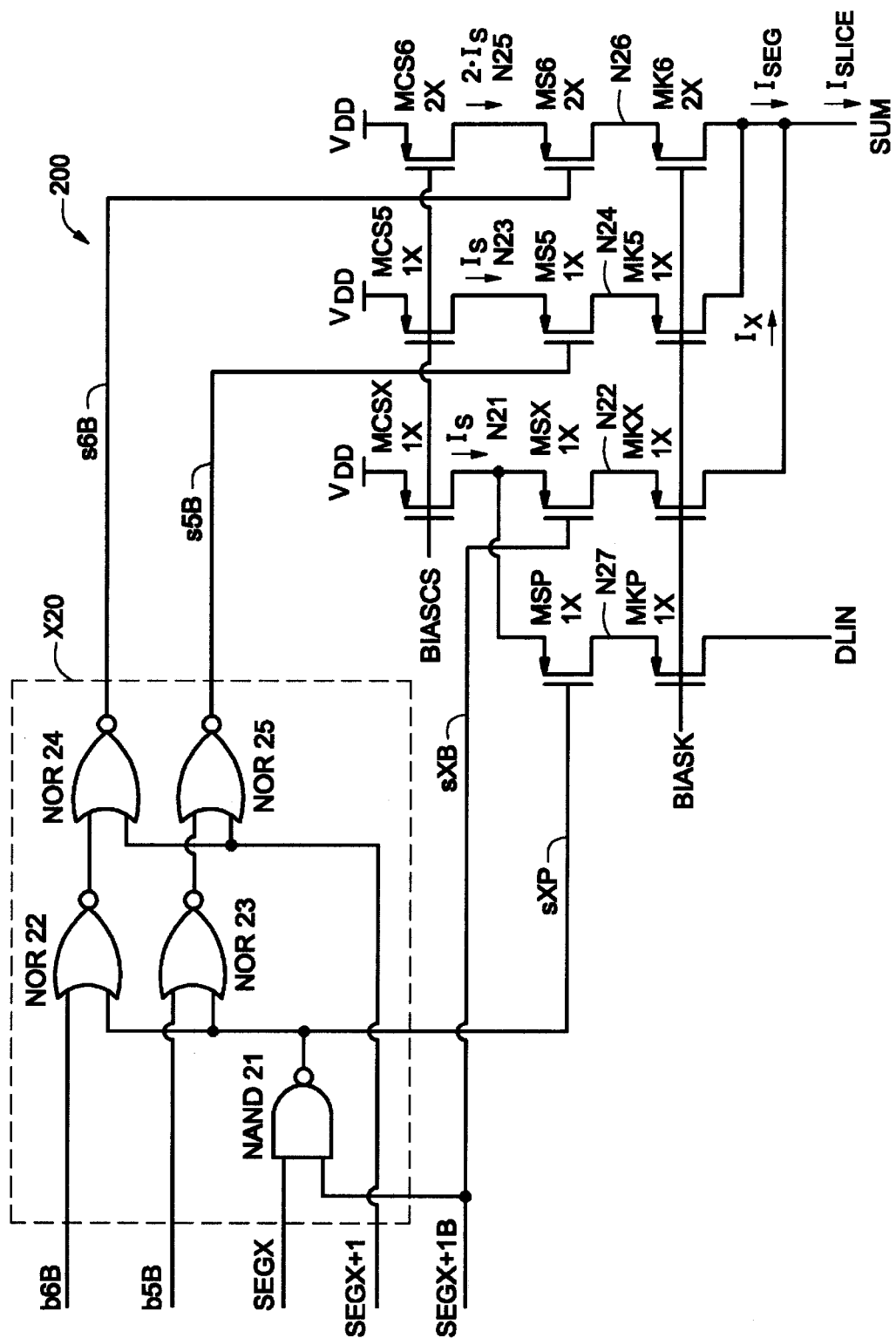
FIG. 2 is a schematic diagram of an exemplary DAC slice circuit.

FIG. 2 is a schematic diagram of an exemplary DAC slice circuit (200) that is arranged in accordance with the present invention. DAC slice circuit 200 includes a digital slice logic circuit (X20), and eleven P-type field effect transistors (FETs MCSX, MCS5, MCS6, MSP, MSX, MS5, MS6, MKP, MKX, MK5, MK6). Digital slice logic circuit X20 includes a nand logic gate (NAND21) and four nor logic gates (NOR22–NOR25).

Transistor MCSX includes a source that is coupled to power supply VDD, a gate that is coupled to bias signal BIASCS, and a drain that is coupled to node N21. Transistor MSX includes a source that is coupled to node N21, a gate that is coupled to segment control signal sXB, and a drain that is coupled to node N22. Transistor MKX includes a source that is coupled to node N22, a gate that is coupled to bias signal BIASK, and a drain that is coupled to node SUM. Transistor MSP includes a source that is coupled to node N21, a gate that is coupled to segment control signal sXP, and a drain that is coupled to node N27. Transistor MKP includes a source that is coupled to node N27, a gate that is coupled to bias signal BIASK, and a drain that is coupled to node DLIN. Transistor MCS5 includes a source that is coupled to a power supply (VDD), a gate that is coupled to a bias signal (BIASCS), and a drain that is coupled to node N23. Transistor MS5 includes a source that is coupled to node N23, a gate that is coupled to segment control signal s5B, and a drain that is coupled to node N24. Transistor MK5 includes a source that is coupled to node N24, a gate that is coupled to bias signal BIASK, and a drain that is coupled to node SUM. Transistor MCS6 includes a source that is coupled to a power supply (VDD), a gate that is coupled to a bias signal (BIASCS), and a drain that is coupled to node N25. Transistor MS6 includes a source that is coupled to node N25, a gate that is coupled to segment control signal s6B, and a drain that is coupled to node N26. Transistor MK6 includes a source that is coupled to node N26, a gate that is coupled to bias signal BIASK, and a drain that is coupled to node SUM.

Digital slice logic circuit X20 is arranged to provide segment controls signals s5B, s6B, sXB, and sXP in response to inverse data bits b5B, b6B, and signals SEGX, SEGX+1 and SEGX+1B. Signals SEGX, SEGX+1 and SEGX+1B correspond to control signals from decoder circuit 400 as described with reference to FIG. 1. For example, SEGX is a control signal that is associated with a first DAC slice circuit (or segment). SEGX+1 is a control signal that is associated with a second DAC slice circuit that is adjacent to the current segment. SEGX+1B is an inverse of the SEGX+1 signal.

Transistors MCSX, MCS5, and MCS6 correspond to illustrative current sources (means for providing current) that are arranged to provide currents to nodes N21, N23, and N25 respectively when selected by a means for selecting. Transistors MSX, MS5, and MS6 correspond to illustrative means for selecting that are arranged to select their respective current sources in response to segment control signals sXB, s5B, and s6B respectively. Transistor MSP corresponds to an illustrative means for steering current from current source MCSX to provide IDLIN to the DLIN node. Transistors MKP, MKX, MK5, and MK6 corresponds to optional cascodes for their respective current sources. The cascode transistors operate as a means for cascoding their respective current sources. Cascoding a current source increases the output impedance of the current source, and provides improved matching of current sources under wide supply conditions.

Each current source is arranged to provide current when selected. Transistors MCSX, MSX, and MKX are configured to operate as a current source that is selected to provide a current corresponding to "BIT X." Transistors MCS5, MS5, and MK5 are configured to operate as a selectable current source that is selected to provide a current corresponding to "BIT 5." Transistors MCS6, MS6, and MK6 are configured to operate as a selectable current source that is selected to provide a current corresponding to "BIT 6." The transistors are scaled relative to one another such that BIT5 and BIT X have associated currents that are of equal magnitudes (IS) when active, and BIT 6 has an associated current that is scaled by a factor of two (e.g., 2IS) with respect to the current associated with BIT 5. BIT 5 and BIT 6 correspond to binary weighted current sources.

DAC slice circuit 200 is configured in the "fully off" operating state when signals SEGX and SEGX+1 are inactive. Segment control signals sXP, sXB, s5B, and s6B are inactive in the "fully off" state such that DAC slice circuit 200 provides no output current to either the SUM or DLIN nodes. DAC slice circuit 200 is configured in the "partially on" operating state when signal SEGX is active and signal SEGX+1is inactive. Signal sXB is inactive, sXP is active, and signals s5B, and s6B are active or inactive in response to signals b5B and b6B in the "partially on" state such that DAC slice circuit 200 provides a DLIN current (IS) to the DLIN node, and a segment current (e.g., 0, IS, 2IS, 3IS) to the SUM node. In the "fully on" operating state, DAC slice circuit 400 provides a slice current (ISLICE) to the SUM node corresponding to BITX, BIT5, and BIT6. The slice current (ISLICE) in the "fully on" operating state has a weight corresponding to BIT 7. For example, four unit currents (4IS) are provided to the SUM node when BIT 5 is a unit current (IS), BIT X is a unit current (IS) and BIT 6 is twice a unit current (2IS). Four unit currents have a binary weight that corresponds to BIT 6 times two, or BIT 7. No current is provided to the DLIN node when operating in the "fully on" operating state.

Each DAC slice circuit (200) provides a segment current (ISEG) that corresponds to a portion of the total current (ISUM) at node SUM. Although the above-described example illustrates a two-bit DAC slice, any number of bits may be employed. For example, a three-bit DAC slice may be employed using an additional binary current source that is selectively coupled to the SUM node. Generically, a "j" bit DAC slice circuit is controlled by "j" middle-order bits ($mb_1 \ldots mb_j$).

The segment current (ISEG) for a generic "j" bit DAC slice circuit is given by:

$$ISEG=IS \times [mb_1 + (mb_2 \times 2) + \ldots + (mb_j \times 2^{(j-1)})]$$

Alternatively, the segment current (ISEG) is described with reference to N data bits including i low-order bits, and j middle-order bits as given by:

$$ISEG = IS \times \sum_{z=1}^{j} b_{(z+i)} \times 2^{(z-1)}.$$

The slice current (ISLICE) from each selected DAC slice circuit (200) corresponds to the sum of a segment current (ISEG) and an extra current (IX). As discussed above, the segment current (ISEG) for a selected DAC slice circuit is determined by middle-order bits b5–b6. The extra current (IX) corresponds to zero when signal SXB deactivates transistor MSX, indicating that an adjacent DAC slice circuit is not selected. The selected DAC slice circuit is in the "fully on" operating state when signal SXB activates transistor MSX, indicating that the adjacent DAC slice circuit is selected. The extra current (IX) corresponds to a unit current (IS) such that the slice current corresponds to four unit currents (4IS) when the selected DAC slice circuit is in the "fully on" operating state.

The DAC_LOW input current (IDLIN) is provided to node DLIN by the DAC slice circuit (200). The DAC_LOW circuit (300, see FIG. 1) is coupled to node DLIN such that the DAC_LOW circuit receives the DAC_LOW input current (IDLIN) from node DLIN. However, the DAC_LOW input current (IDLIN) corresponds to either zero or the unit current (IS) depending upon segment control signal sXP. Segment control signal sXP is activated when the SEGX and SEGX+1B signals are asserted such that the current DAC slice circuit is selected and the next adjacent DAC slice circuit is inactive. Since the decoder circuit (400, see FIG. 1) selectively activates each DAC slice circuit (200) according to a thermometer decode, only one of the DAC slice circuits can provide the DAC_LOW input current (IDLIN) to the DAC_LOW circuit. Thus, the DAC_LOW input current (IDLIN) corresponds to zero for all DAC slice circuits except for the last selected (according to the thermometer code) DAC slice circuit.

Figure 3:
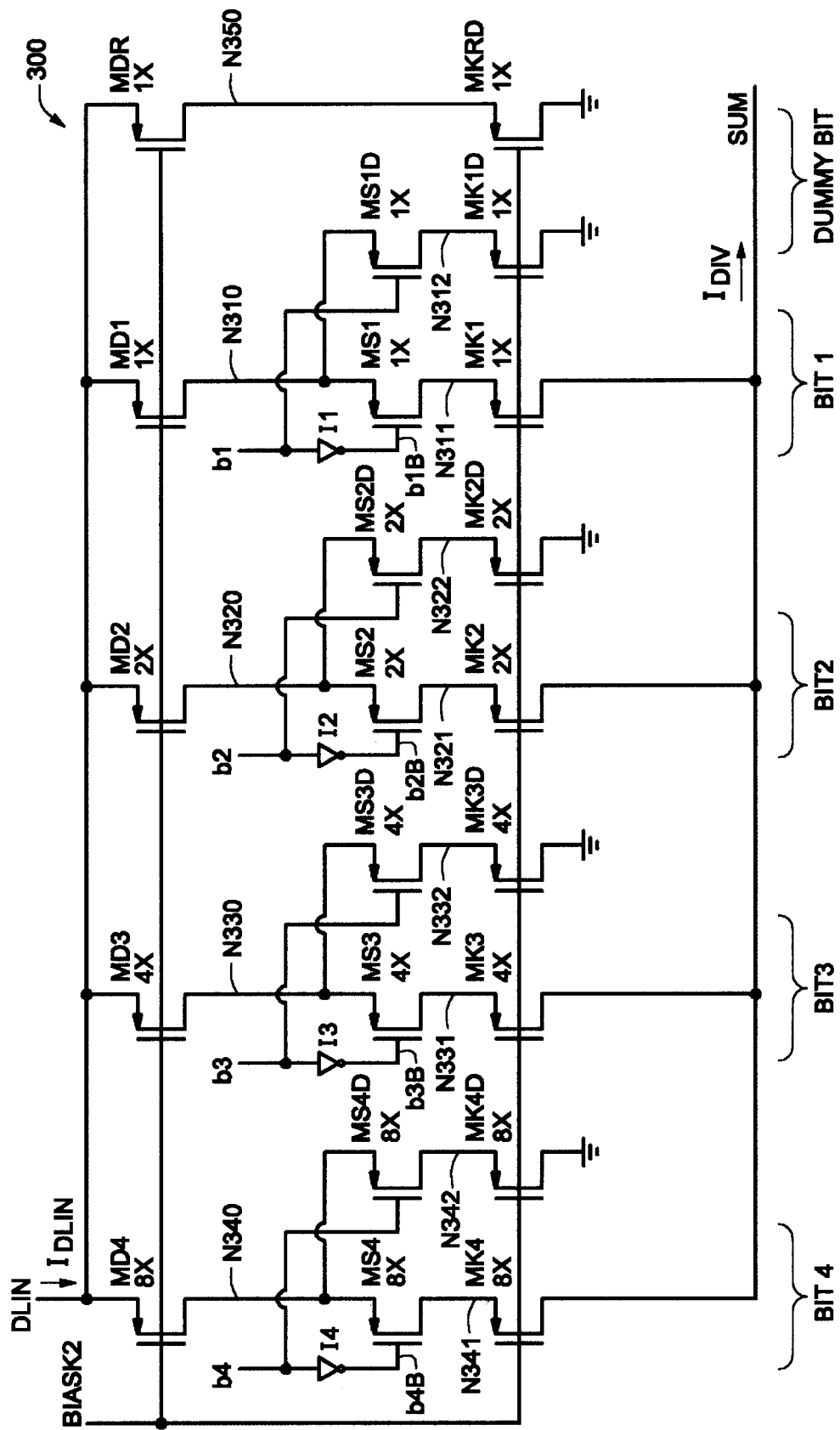
FIG. 3 is a schematic diagram of an exemplary DAC low circuit.

FIG. 3 is a schematic diagram of an exemplary DAC_LOW circuit (300) that is arranged in accordance with the present invention. DAC_LOW circuit 300 includes four inverter logic gates (I1–I4), and twenty-two P-type field effect transistors (FETs MDR, MD1–MD4, MS1–MS4, MS1D–MS4D, MKRD, MK1–MK4, and MK1D–MK4D).

Transistor MD4 has a source that is coupled to node DLIN, a gate that is coupled to biasing signal BIASK2, and a drain that is coupled to node N340. Transistor MS4 has a source that is coupled to node N340, a gate that is coupled to signal b4B, and a drain that is coupled to node N341. Transistor MK4 has a source that is coupled to node N341, a gate that is coupled to biasing signal BIASK2, and a drain that is coupled to node SUM. Transistor MS4D has a source that is coupled to node N340, a gate that is coupled to signal $b_4$, and a drain that is coupled to node N342. Transistor MK4D has a source that is coupled to node N342, a gate that is coupled to biasing signal BIASK2, and a drain that is coupled to ground.

Transistor MD3 has a source that is coupled to node DLIN, a gate that is coupled to biasing signal BIASK2, and a drain that is coupled to node N330. Transistor MS3 has a source that is coupled to node N330, a gate that is coupled to signal b3B, and a drain that is coupled to node N331. Transistor MK3 has a source that is coupled to node N331, a gate that is coupled to biasing signal BIASK2, and a drain that is coupled to node SUM. Transistor MS3D has a source that is coupled to node N330, a gate that is coupled to signal $b_3$, and a drain that is coupled to node N332. Transistor MK3D has a source that is coupled to node N332, a gate that is coupled to biasing signal BIASK2, and a drain that is coupled to ground.

Transistor MD2 has a source that is coupled to node DLIN, a gate that is coupled to biasing signal BIASK2, and a drain that is coupled to node N320. Transistor MS2 has a source that is coupled to node N320, a gate that is coupled to signal b2B, and a drain that is coupled to node N321. Transistor MK2 has a source that is coupled to node N321, a gate that is coupled to biasing signal BIASK2, and a drain that is coupled to node SUM. Transistor MS2D has a source that is coupled to node N320, a gate that is coupled to signal $b_2$, and a drain that is coupled to node N322. Transistor MK2D has a source that is coupled to node N322, a gate that is coupled to biasing signal BIASK2, and a drain that is coupled to ground.

Transistor MD1 has a source that is coupled to node DLIN, a gate that is coupled to biasing signal BIASK2, and a drain that is coupled to node N310. Transistor MS1 has a source that is coupled to node N310, a gate that is coupled to signal b1B, and a drain that is coupled to node N311. Transistor MK1 has a source that is coupled to node N311, a gate that is coupled to biasing signal BIASK2, and a drain that is coupled to node SUM. Transistor MS1D has a source that is coupled to node N310, a gate that is coupled to signal $b_1$, and a drain that is coupled to node N312. Transistor MK1D has a source that is coupled to node N312, a gate that is coupled to biasing signal BIASK2, and a drain that is coupled to ground.

Transistor MDR has a source that is coupled to node DLIN, a gate that is coupled to biasing signal BIASK2, and a drain that is coupled to node N350. Transistor MKRD has a source that is coupled to node N350, a gate that is coupled to biasing signal BIASK2, and a drain that is coupled to ground.

During operation, inverter logic gates I1–I4 are arranged to provide inverse signals b1B–b4B in response to signals from low-order bits $b_1$–$b_4$, respectively. Transistors MD4, MD3, MD2, MD1, and MDR are arranged to operate as a means for dividing the DAC_LOW input current (IDLIN). Transistor pairs MS1, MS1D; MS2, MS2D; MS3, MS3D; and MS4, MS4D are arranged to operate as means for selectively steering current between the SUM node and ground in response to low-order bits $b_1$–$b_4$.

DAC_LOW circuit (300) is arranged to receive the DAC_LOW input current (IDLIN) and provide a divided current (IDIV) to the SUM node. The divided current (IDIV) corresponds to a binary weighted scaling of the DAC_LOW input current (IDLIN). The transistors in FIG. 3 are scaled relative to one another such that the current is divided accordingly. Transistors MDR and MKRD are scaled by a factor of one, corresponding to a dummy bit that is discarded. Transistors MD1, MS1, MS1D, MK1, and MK1D are scaled by a factor of one, corresponding to BIT 1. Transistors MD2, MS2, MS2D, MK2, and MK2D are scaled by a factor of two, corresponding to BIT 2. Transistors MD3, MS3, MS3D, MK3, and MK3D are scaled by a factor of four, corresponding to BIT 3. Transistors MD4, MS4, MS4D, MK4, and MK4D are scaled by a factor of eight, corresponding to BIT 4.

Each BIT illustrated in FIG. 3 includes a means for steering current between the SUM node and ground. Each current steering mechanism is illustrated as a set of switching transistors that direct the current flow based on the particular bit. The current divider circuits (MDR, MD1–MD4) are arranged to provide a division of the DAC_LOW input current (IDLIN). Each binary weighted current divider circuit contributes to the divided current (IDIV) such that BIT 1 corresponds to 1/16 of IDIV, BIT 2 corresponds to 1/8 of IDIV, BIT 3 corresponds to 1/4 of IDIV, and BIT 4 corresponds to 1/2 of IDIV. The current steering circuits cooperate with the current divider circuits to provide a conduction path from the each current divider circuit to the SUM node based on the code word that is associated with low-order bits $b_1$–$b_4$. The divided current (IDIV) is thus related to a fractional portion of the DAC_LOW input current (IDLIN) as determined by the low-order bits.

Transistors MK1–MK4, MK1D–MK4D, and MKRD correspond to optional cascodes for their respective current dividers (MD1–MD4, and MDR). The cascode transistors operate as a means for cascoding their respective current dividers. Cascoding a current source increases the output impedance of the current dividers, improves matching between current dividers, and reduces the sensitivity of the current division to the voltage at node SUM, and the power supply voltage.

DAC_LOW circuit 300 illustrates an example binary weighted current division DAC that corresponds to a four-bit conversion associated with low-order bits $b_1$–$b_4$. However, any number of low-order bits may be employed. For example, a system with a two-bit DAC_LOW circuit requires two current division circuits, while a system with a five-bit DAC_LOW circuit requires five current division circuits. Generically, $2^{(i-1)}$ current division circuits correspond to "i" low-order bits. The divided current (IDIV) for a generic current divider circuit is thus given by:

$$IDIV = IDLIN \times \left\{ \frac{b_1 + \ldots + (b_i \times 2^{(i-1)})}{2^i} \right\}$$

Alternatively, the divided current (IDIV) is described with reference to i low-order bits as given by:

$$IDIV = \frac{IDLIN}{2^i} \times \sum_{z=1}^{i} b_{(z)} \times 2^{(z-1)}$$

The DAC_LOW circuit (300, see FIG. 1) is coupled to node SUM such that the DAC_LOW circuit provides the divided current (IDIV) to node SUM. The DAC_LOW input current (IDLIN) is provided to node DLIN by the DAC slice circuit (200) as previously described. Since the decoder circuit (400, see FIG. 1) selectively activates each DAC slice circuit (200) according to the thermometer code, one of the selected DAC slice circuits provides the DAC_LOW input current (IDLIN) to the DAC_LOW circuit.

Figure 4:
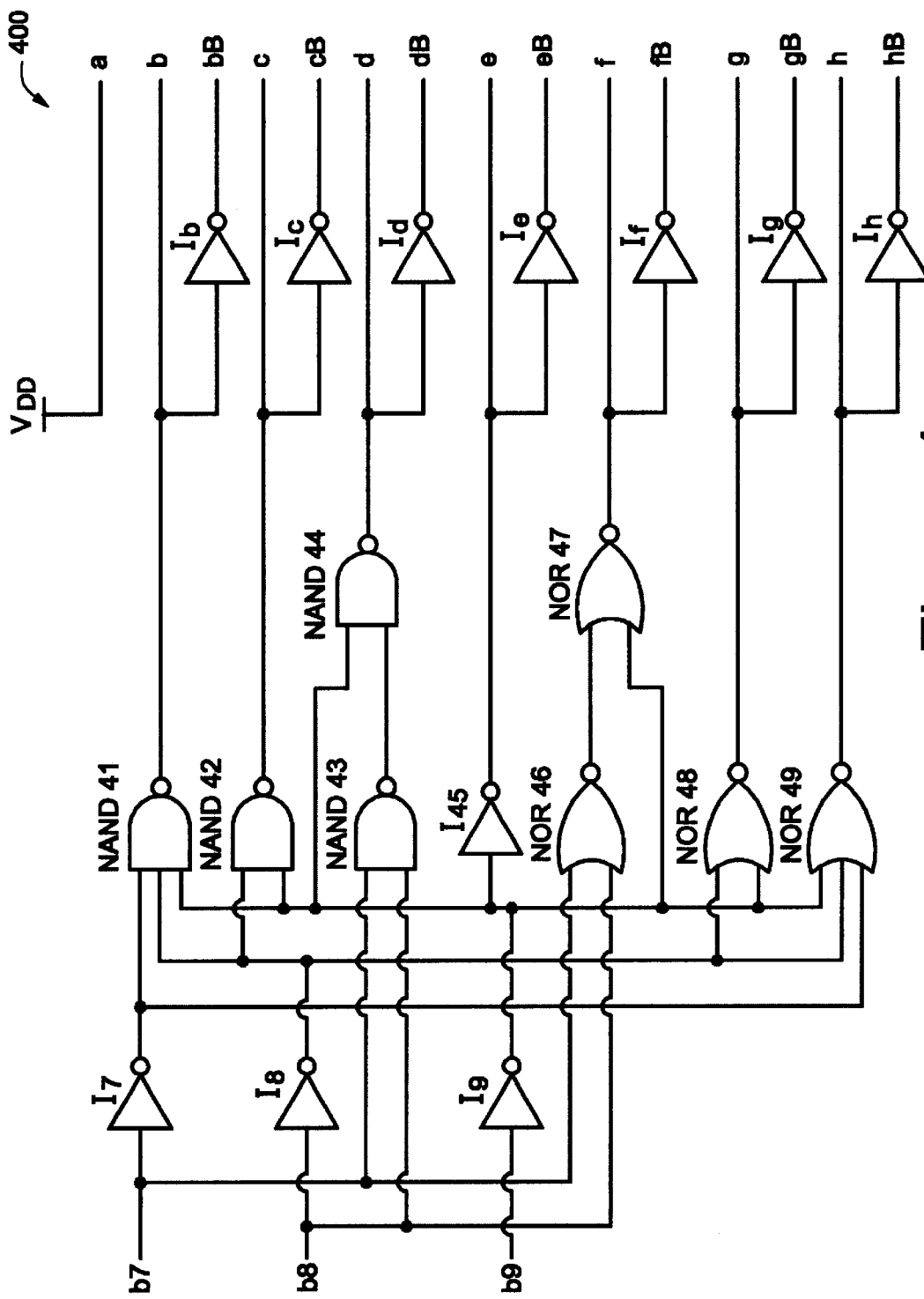
FIG. 4 is a schematic diagram of exemplary decoder circuit, in accordance with the present invention.

FIG. 4 is a schematic diagram of an exemplary decoder circuit (400) that is arranged in accordance with the present invention. Decoder circuit 400 includes eleven inverter logic gates (I7–I9, Ib–Ih, I45), four nand logic gates (NAND41–44), and four nor logic gates (NOR46–49).

Exemplary decoder circuit (400) is arranged to provide control signals to each DAC slice circuit (200) as illustrated in FIG. 1. The control signals associated with each respective DAC slice circuit corresponds to control signals a–h. Each of control bits a–h operates in either a high logic state (logic "1") or a low logic state (logic "0"). Additional inverse control signals (bB–hB) are provided by associated inverters Ib–Ih in response to control signals b–h.

The exemplary decoder circuit (400) is arranged to provide a thermometer code in response to high-order bits $b_7$–$b_9$ in accordance with the truth table described below.

| $b_9$ | $b_8$ | $b_7$ | a | b | c | d | e | f | g | h |
|---|---|---|---|---|---|---|---|---|---|---|
| 0 | 0 | 0 | 1 | 0 | 0 | 0 | 0 | 0 | 0 | 0 |
| 0 | 0 | 1 | 1 | 1 | 0 | 0 | 0 | 0 | 0 | 0 |
| 0 | 1 | 0 | 1 | 1 | 1 | 0 | 0 | 0 | 0 | 0 |
| 0 | 1 | 1 | 1 | 1 | 1 | 1 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 0 | 0 |
| 1 | 1 | 0 | 1 | 1 | 1 | 1 | 1 | 1 | 1 | 0 |
| 1 | 1 | 1 | 1 | 1 | 1 | 1 | 1 | 1 | 1 | 1 |

Each DAC slice circuit is activated when a corresponding one of control signals a–h is in a high logic state (logic "1"). As noted above, each of control signals b–h is asserted as a logic "1" in sequence as the binary code word associated with high-order bits $b_7$–$b_9$ increases. Thus, adjacent DAC slice circuits are activated in sequence as the binary code word associated with high-order bits $b_7$–$b_9$ increases in value.

The above described decoder circuit corresponds to three high-order bits (bits $b_7$–$b_9$) and eight DAC slice circuits (200). However, any number of high-order bits may be employed based on the number of DAC slice circuits (200) that are used in the system. For example, a system with four DAC slice circuits requires four control signals from the decoder circuit such that two high-order bits are used. Similarly, a system with sixteen DAC slice circuits requires sixteen control signals from the decoder circuit such that four high-order bits are used. Generically, $2^{(k)}$ DAC slice circuits and associated control signals correspond to "k" high-order bits.

The transfer function for a DAC system that is arranged in accordance with the present invention increases monotonically with increasing binary code. The DAC_LOW circuit receives the DAC_LOW input current (IDLIN) from one of the DAC slice circuits. During a code transition between the low-order bits and the middle-order bits, all of the low-order bits are cleared to logic "0," and current is redirected inside the DAC slice. When the DAC slice is "fully-on," the current that was previously supplied to the DLIN node is provided to the SUM node. Differential non-linearity errors are minimized since the total current output is always increased with increasing code, and none of the current sources that are used for the low-order bits are turned off with increasing code. The DAC slice circuits are activated in unary fashion in response to the high-order bits.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for providing an output current in response to bits, comprising:
    a decoder circuit that is arranged to provide control signals in response to high-order bits;
    at least two DAC slice circuits that are activated in response to a respective one of the control signals, wherein each DAC slice circuit is configured to provide a segment current to a SUM node when activated such that a magnitude associated with the segment current is determined by middle-order bits, wherein each DAC slice circuit is also arranged to selectively provide a DAC_LOW input current to a DAC_LOW input node; and
    a DAC_LOW circuit that is configured to provide a divided current to the SUM node in response to the DAC_LOW input current and low-order bits, wherein the DAC_LOW input current is received from one of the first second DAC slice circuits and the divided current corresponds to a scaled version of the DAC_LOW input current such that the output current is associated with a sum of the segment currents and the divided current.

2. The apparatus of claim 1, wherein the decoder circuit is arranged to provide a thermometer code such that each successive one of the control signals is activated as a digital code associated with the bits increases in value.

3. The apparatus of claim 1, wherein each DAC slice circuit is arranged to operate in one of a fully off operating state, a partially on operating state, and a fully on operating state, wherein the operating state corresponds to fully off when the segment current and the DAC_LOW input current are zero, the operating state corresponds to partially on when the segment current is determined by the middle-order bits, and the DAC_LOW input current is non-zero, and the operating state corresponds to fully on when the segment current corresponds to the total current from the DAC slice, and the DAC_LOW input current is zero, wherein the operating state is determined by the control signals for the DAC slice.

4. The apparatus of claim 1, each DAC slice circuit further comprising:
    a first current source circuit that is arranged to selectively provide a first current to the SUM node when activated by a first segment control signal;
    a second current source circuit that is arranged to selectively provide a second current to the SUM node when activated by a second segment control signal, wherein the second current is doubled in magnitude to the first current; and
    a third current source circuit that is arranged to selectively provide a third current to the SUM node when activated by a third segment control signal, and arranged to selectively provide the third current to the DAC_LOW input node as the DAC_LOW input current when activated by a fourth segment control signal, wherein the third current is equal in magnitude to the first current.

5. The apparatus of claim 4, each DAC slice circuit further comprising a digital slice logic circuit that is configured to provide the first, second, third, and fourth segment control signals in response to the middle-order bits and the control signals that are associated with the DAC slice circuit.

6. The apparatus of claim 1, wherein each DAC slice circuit is arranged to provide the segment current (ISEG) in response to a number (j) of middle-order bits (mb) as given by $$ISEG = IS \times [mb_1 + \ldots + (mb_j \times 2^{(j-1)})],$$

wherein IS corresponds to a unit current, and $mb_1$ through $mb_j$ corresponds to the middle-order bits.

7. The apparatus of claim 1, wherein the DAC_LOW circuit is arranged to provide the divided current (IDIV) in response to the DAC_LOW input current (IDLIN) and a number (i) of low-order bits as given by:

$$IDIV = IDLIN \times \left\{ \frac{b_1 + \ldots + (b_i \times 2^{(i-1)})}{2^i} \right\},$$

wherein bits $b_1$ through $b_i$ correspond to the low-order bits.

8. The apparatus of claim 7, wherein the DAC_LOW input current (IDLIN) corresponds to the unit current (IS).

9. The apparatus of claim 6, wherein the DAC_LOW input current (IDLIN) is provided by a selected one of the DAC slice circuits when an adjacent one of the DAC slice circuits is inactive.

10. The apparatus of claim 1, the DAC_LOW circuit further comprising:
 a first current divider circuit that is coupled to the DAC_LOW input node and arranged to provide a first current that is associated with a first bit of the DAC_LOW circuit;
 a first current steering circuit that is responsive to a first one of the low-order bits, and arranged to selectively couple the first current to one of the SUM node and ground;
 a second current divider circuit that is coupled to the DAC_LOW input node and arranged to provide a second current that is associated with a second bit of the DAC_LOW circuit, wherein the second current is doubled in magnitude to the first current;
 a second current steering circuit that is responsive to a second one of the low-order bits, and arranged to selectively couple the second current to one of the SUM node and ground; and
 a third current divider circuit that is coupled to the DAC_LOW input node and arranged to provide a third current that is associated with a dummy bit to ground, wherein the third current is equal in magnitude to the first current such that the sum of the first, second and third currents corresponds to the DAC_LOW input current, and the divided current is selectively provided to the SUM node.

11. An apparatus for providing an output current in response to N bits that are organized as i low-order bits, j middle-order bits, and k high-order bits, the apparatus comprising:
 a decoder circuit that is arranged to provide control signals in response to the k high-order bits;
 at least two DAC slice circuits that are activated in response to a respective one of the control signals, wherein each activated DAC slice circuit is arranged to selectively provide a segment current (ISEG) to a SUM node in response to the j middle-order bits as given by:

$$ISEG = IS \times \sum_{z=1}^{j} b_{(z+i)} \times 2^{(z-1)},$$

wherein IS corresponds to a current of unit magnitude, each activated DAC slice circuit is arranged to selectively provide an extra current (IX) with a unit magnitude to the SUM node when a correspondingly adjacent one of the DAC slice circuits is also activated, and wherein one of the activated DAC slice circuits is arranged to selectively provide a DAC_LOW input current (IDLIN) with a unit magnitude; and
 a DAC_LOW circuit that is configured to provide a divided current (IDIV) to the SUM node in response to the DAC_LOW input current (IDLIN) and the i low-order bits as given by:

$$IDIV = \frac{IDLIN}{2^i} \times \sum_{z=1}^{i} b_{(z)} \times 2^{(z-1)},$$

wherein the divided current (IDIV) corresponds to a division of the DAC_LOW input current (IDLIN) as determined by the i low-order bits, such that the output current is determined by the sum of the divided current (IDIV), the segment currents (ISEG), and the extra currents (IX), which are combined at the SUM node.

12. The apparatus of claim 11, wherein N corresponds to nine, k corresponds to three, and the decoder circuit is arranged to provide control signals a through h in response to high-order bits $b_7$ through $b_9$ as given by:

| $b_9$ | $b_8$ | $b_7$ | a | b | c | d | e | f | g | h |
|---|---|---|---|---|---|---|---|---|---|---|
| 0 | 0 | 0 | 1 | 0 | 0 | 0 | 0 | 0 | 0 | 0 |
| 0 | 0 | 1 | 1 | 1 | 0 | 0 | 0 | 0 | 0 | 0 |
| 0 | 1 | 0 | 1 | 1 | 1 | 0 | 0 | 0 | 0 | 0 |
| 0 | 1 | 1 | 1 | 1 | 1 | 1 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 0 | 0 |
| 1 | 1 | 0 | 1 | 1 | 1 | 1 | 1 | 1 | 1 | 0 |
| 1 | 1 | 1 | 1 | 1 | 1 | 1 | 1 | 1 | 1 | 1 |

13. The apparatus of claim 11, wherein the decoder circuit is arranged to provide $2^k$ segment control signals in response to the k high-order bits, and wherein the at least two DAC slice circuits comprise $2^k$ DAC slice circuits, wherein each of the $2^k$ DAC slice circuits are responsive to at least one of the $2^k$ segment control signals.

14. The apparatus of claim 13, wherein the decoder circuit that is further arranged to provide $2^k$ inverse segment control signals in response to the k high-order bits, wherein each of the DAC slice circuits is activated in responsive to a respective one of the $2^k$ segment control signals, and wherein each of the activated DAC slice circuits is responsive to one of the $2^k$ inverse segment control signals.

15. The apparatus of claim 14, wherein each DAC slice circuit is further arranged to provide the DAC_LOW input current when the respective one of the $2^k$ segment control signals and the respective one of the $2^k$ inverse segment control signals correspond to a logic level such that the respective DAC slice is activated.

16. An apparatus for providing an output current in response to bits that are organized as low-order bits, middle-order bits, and high-order bits, the apparatus comprising:
 a means for providing control signals that is arranged to provide segment control signals in response to the high-order bits;
 a first means for converting that is arranged to provide a first segment current in response to the middle-order bits when selected by a first respective one of the segment control signals, and further arranged to provide a first extra current when activated in a fully on operating state;
 a second means for converting that is arranged to provide a second segment current in response to the middle-order bits when selected by a second respective one of the segment control signals, and further arranged to provide a second extra current when activated in the fully on operating state;

a means for providing a DAC_LOW input current; and a means for dividing current that is arranged to provide a divided current in response to the DAC_LOW input current and the low-order bits, wherein the divided current corresponds to a division of the DAC_LOW input current, and the divided current is combined with the segment currents and the extra currents to provide a conversion current.

17. The apparatus of claim 16, further comprising a means for providing the output current in response to the conversion current.

18. The apparatus of claim 16, wherein each of the first and second means for converting comprises:

a first means for providing current that is arranged to provide a first current;

a second means for providing current that is arranged to provide a second current that is double in magnitude to the first current;

a third means for providing current that is arranged to provide a third current that is equal in magnitude to the first current;

a first means for selecting that is arranged to couple the first current to a SUM node;

a second means for selecting that is arranged to couple the second current to the SUM node;

a third means for selecting that is arranged to couple the third current to the SUM node; and a current steering means that is arranged to steer the third current to a DLIN node such that the third current corresponds to the DAC_LOW input current.

19. The apparatus of claim 18, wherein each of the first and second means for converting further comprises:

a first means for cascoding that is arranged to cascode the first means for providing current;

a second means for cascoding that is arranged to cascode the second means for providing current; and a third means for cascoding that is arranged to cascode the third means for providing current.

20. An apparatus as in claim 16, further comprising a means for steering that is arranged to selectively steer portions of the divided current between the SUM node and ground in response to the low-order bits.

* * * * *